(12) United States Patent
Chou et al.

(10) Patent No.: US 11,189,687 B2
(45) Date of Patent: Nov. 30, 2021

(54) SEMICONDUCTOR DEVICES AND METHODS OF MANUFACTURING THE SAME

(71) Applicant: Vanguard International Semiconductor Corporation, Hsinchu (TW)

(72) Inventors: Yu-Chieh Chou, New Taipei (TW); Hsin-Chih Lin, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 34 days.

(21) Appl. No.: 16/702,078

(22) Filed: Dec. 3, 2019

(65) Prior Publication Data
US 2021/0167165 A1    Jun. 3, 2021

(51) Int. Cl.
| | |
|---|---|
| *H01L 29/06* | (2006.01) |
| *H01L 29/778* | (2006.01) |
| *H01L 29/40* | (2006.01) |
| *H01L 29/66* | (2006.01) |
| *H01L 29/20* | (2006.01) |

(52) U.S. Cl.
CPC ...... *H01L 29/0615* (2013.01); *H01L 29/2003* (2013.01); *H01L 29/401* (2013.01); *H01L 29/402* (2013.01); *H01L 29/66462* (2013.01); *H01L 29/7786* (2013.01)

(58) Field of Classification Search
CPC .............. H01L 29/66462; H01L 29/7786
See application file for complete search history.

(56) References Cited

U.S. PATENT DOCUMENTS

| | | | |
|---|---|---|---|
| 10,886,394 B1 * | 1/2021 | Lin | ................. H01L 29/41766 |
| 2019/0067228 A1 * | 2/2019 | Son | ....................... H01L 23/485 |

FOREIGN PATENT DOCUMENTS

TW      1646591 B      1/2019

OTHER PUBLICATIONS

Taiwanese Office Action and Search Report for Taiwanese Application No. 108119249, dated Aug. 11, 2020.

* cited by examiner

*Primary Examiner* — Raj R Gupta
(74) *Attorney, Agent, or Firm* — Birch, Stewart, Kolasch & Birch, LLP

(57) ABSTRACT

A semiconductor device includes and an active region and a peripheral region. The peripheral region includes a seal region. The semiconductor device includes a substrate and a seed layer one the substrate. The semiconductor device also includes a GaN-containing composite layer on the seed layer, and the GaN-containing composite layer is disposed in the active region and the peripheral region. The semiconductor device also includes a gate electrode, a source electrode and a drain electrode disposed on the GaN-containing composite layer within the active region. The source electrode and the drain electrode are disposed at two opposite sides of the gate electrode. The semiconductor device further includes a sealing structure, and the sealing structure includes a barrier structure and a seal component in the seal region. The barrier structure is disposed around the active region. The barrier structure penetrates the GaN-containing composite layer and the seed layer.

22 Claims, 13 Drawing Sheets

SEMICONDUCTOR DEVICES AND METHODS OF MANUFACTURING THE SAME

BACKGROUND

Technical Field

The disclosure relates to semiconductor devices and methods of manufacturing the same, and in particular to semiconductor devices with barrier structures and methods of manufacturing the same.

Description of the Related Art

In recent years, the development of semiconductor devices for use in computers, consumer electronics and other fields has progressed rapidly. Currently, semiconductor device technology has been widely accepted in Metal-Oxide-Semiconductor Field-Effect Transistor (MOSFET) products that have a high market share. Semiconductor devices are used in a variety of electronic applications, such as high-power devices, personal computers, cell phones, digital cameras, and other electronic devices. These semiconductor devices are typically fabricated by depositing insulating layers or dielectric layers, conductive layer materials, and semiconductor layer materials on a semiconductor substrate, followed by patterning the various material layers by using photolithography processes. Therefore, the circuit devices and components are formed on the semiconductor substrate.

Among these devices, high-electron mobility transistors (HEMTs) have been widely used in the field of high-power applications since they have such advantages as high output power and high breakdown voltage. Although existing semiconductor devices and methods for manufacturing the same have been adequate for their intended purposes, they have not been entirely satisfactory in all respects. Therefore, there are still some problems to be overcome in regards to semiconductor integrated circuits and technology.

SUMMARY

Some embodiments of the present disclosure provide semiconductor devices. A semiconductor device includes a substrate and a seed layer disposed on the substrate in the active region and the peripheral region. The semiconductor device also includes a GaN-containing composite layer disposed on the seed layer in the active region and the peripheral region. The semiconductor device also includes a gate electrode disposed on the GaN-containing composite layer in the active region, and a source electrode and a drain electrode disposed on the GaN-containing composite layer in the active region. The source electrode and the drain electrode are disposed at opposite sides of the gate electrode. The semiconductor device further includes a sealing structure disposed in a seal region of the peripheral region, and the sealing structure includes a barrier structure and a sealing component on the barrier structure. The barrier structure is disposed around the active region, and the barrier structure penetrates the GaN-containing composite layer and the seed layer.

Some embodiments of the present disclosure methods of manufacturing semiconductor devices. A method includes providing a substrate and forming a seed layer on the substrate in the active region and the peripheral region. The method includes forming a GaN-containing composite layer on the seed layer in the active region and the peripheral region. The method also includes forming a barrier structure in a seal region of the peripheral region. The barrier structure is disposed around the active region. The barrier structure penetrates the GaN-containing composite layer and the seed layer. The method further includes forming a gate electrode on the GaN-containing composite layer in the active region, and forming a source electrode and a drain electrode disposed on the GaN-containing composite layer in the active region. The source electrode and the drain electrode are disposed at opposite sides of the gate electrode. The method still further includes forming a sealing component on the barrier structure in the seal region. The sealing component and the barrier structure form a sealing structure.

A detailed description is given in the following embodiments with reference to the accompanying drawings.

BRIEF DESCRIPTION OF THE DRAWINGS

The embodiments of the disclosure can be more fully understood by reading the subsequent detailed description and examples with references made to the accompanying drawings. For clarity of illustration, various elements in the drawings may not be drawn in scale, wherein.

DETAILED DESCRIPTION

Figure 1:
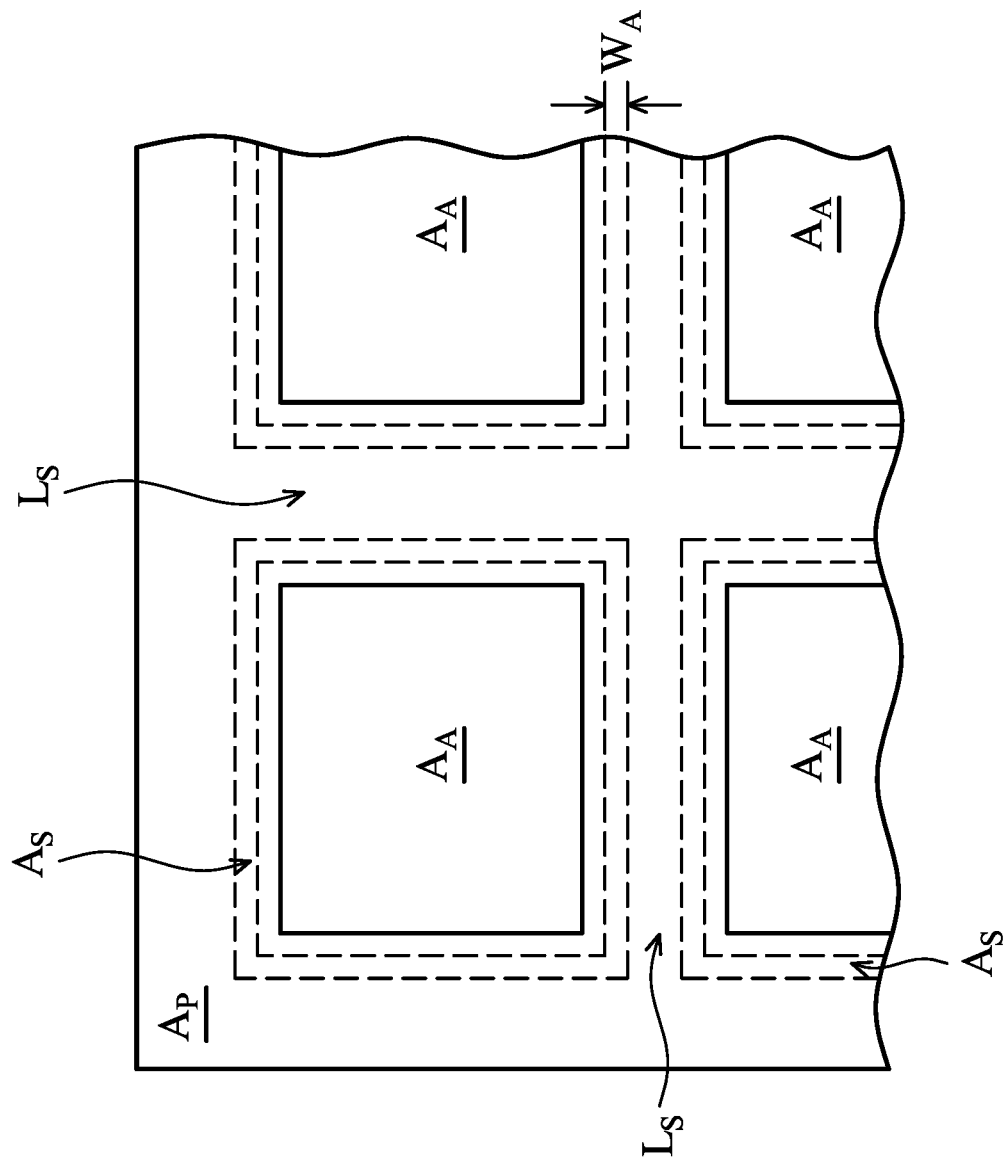
FIG. 1 illustrates active regions, a peripheral region and seal regions of a semiconductor device in accordance with some embodiments of the present disclosure.

The following description provides various embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numbers and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments are described below. Throughout the various views and illustrative embodiments, similar reference numbers are used to designate similar features/components. It should be understood that additional operations can be provided before, during, and after the method, and some of the operations can be replaced or eliminated for other embodiments of the method.

Embodiments provide semiconductor devices and methods of manufacturing the same. An exemplary embodiment of a semiconductor device includes an active region and a peripheral region. The peripheral region includes cutting lines and a seal region in which a sealing component is disposed. The seal region is disposed around the active region, and is positioned between the cutting lines and the active region. In some embodiment, a sealing structure includes a barrier structure and a sealing component formed above the barrier structure. In some embodiment, a semiconductor device includes a GaN-containing composite layer and a seed layer formed above a substrate. The barrier structure at least penetrates the GaN-containing composite layer and the seed layer. When the wafer dicing is performed along the cutting lines $L_S$, the barrier structure of the embodiments effectively blocks the cracks generating between the GaN-containing composite layer and the seed layer from entering the active region. Thus, electrical components fabricated in the active region can be protected, thereby significantly improving the yield and the quality of the electrical components of the semiconductor device.

FIG. 1 illustrates active regions, a peripheral region and seal regions of a semiconductor device in accordance with some embodiments of the present disclosure. The peripheral region $A_P$ surrounds the active regions $A_A$. In some embodiment, the peripheral region $A_P$ includes cutting lines $L_S$ and seal regions $A_S$. As shown in FIG. 1, the seal regions $A_S$ are disposed between the cutting lines $L_S$ and the active regions $A_A$. A sealing structure is disposed in the seal regions $A_S$. A sealing structure includes a barrier structure and a sealing component disposed above the barrier structure in accordance with some embodiment. In some embodiment, a width $W_A$ of the seal regions $A_S$ is in a range of about 1 μm to about 10 μm.

Figure 2:
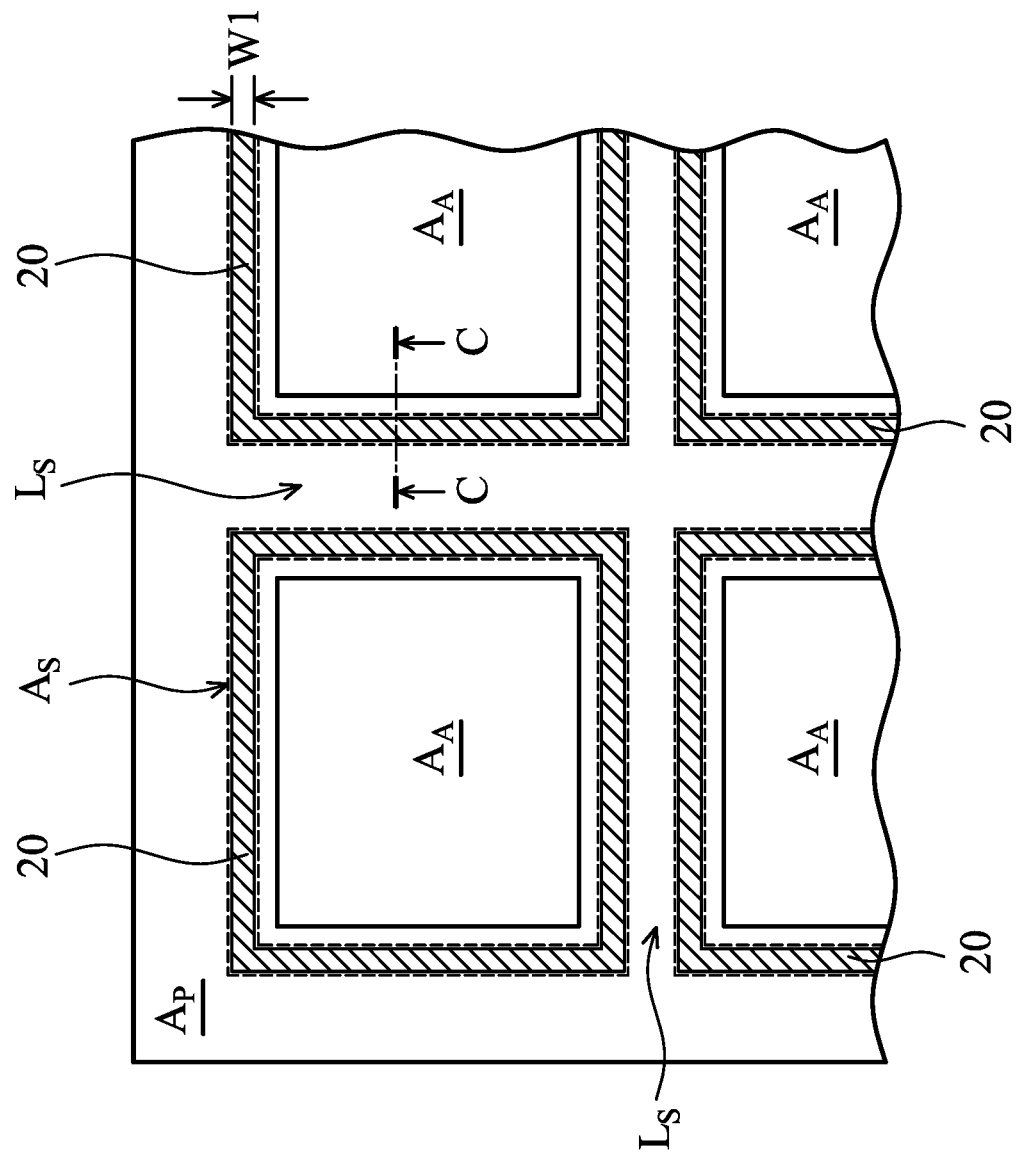
FIG. 2 is a top view of barrier structures of a semiconductor device in accordance with some embodiments of the present disclosure.

FIG. 2 is a top view of barrier structures of a semiconductor device in accordance with some embodiments of the present disclosure. In some embodiment, a sealing component (not shown) is disposed above the barrier structure 20 in each of the seal regions $A_S$. The sealing component and the barrier structure 20 form a sealing structure. In some embodiment, the sealing component is a seal ring, which prevents moisture from penetrating into electrical components fabricating in the active region $A_A$. In some embodiment, the semiconductor device includes a GaN-containing composite layer. Arrangement of the barrier structures 20 can effectively block the cracks generated at an interface between the GaN-containing composite layer and a seed layer from entering the active regions $A_A$ during wafer dicing. In some embodiment, a width W1 of the barrier structure 20 is in a range of about 1 μm to about 10 μm.

FIG. 3A-FIG. 3E illustrate cross-sectional views of intermediate stages of a method of manufacturing a semiconductor device in accordance with some embodiments of the present disclosure. For example, FIG. 3A-FIG. 3E are cross-sectional views of intermediate stages of processes along line C-C of the semiconductor device in FIG. 2.

Figure 3A:
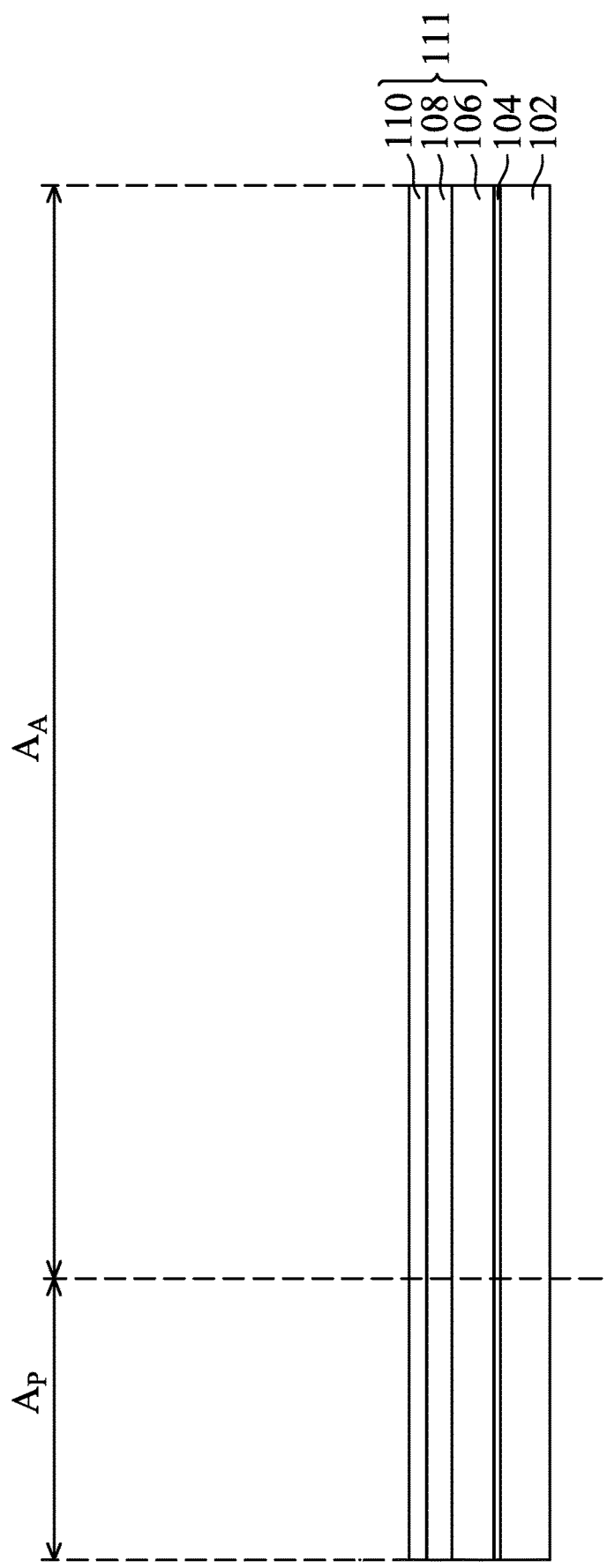
FIG. 3A, FIG. 3B, FIG. 3C, FIG. 3D and FIG. 3E illustrate cross-sectional views of intermediate stages of a method of manufacturing a semiconductor device in accordance with some embodiments of the present disclosure.

As shown in FIG. 3A, a substrate 102 is provided, in accordance with some embodiments. In some embodiments, the substrate 102 includes a ceramic material. The ceramic material may include a metal inorganic material. In some other embodiments, the substrate 102 is made of silicon (Si), germanium (Ge), silicon carbide (SiC), gallium nitride (GaN), silicon dioxide ($SiO_2$), sapphire or a combination thereof. The aforementioned sapphire substrate may be formed by aluminum nitride and gallium nitride formed on the aluminum nitride. In some embodiments, the substrate 102 may include alloy semiconductor such as silicon germanium (SiGe), silicon germanium carbide (SiGeC), gallium arsenic phosphide (GaAsP), or gallium indium phosphide (GaInP). In some embodiments, the substrate 102 may be a single crystal substrate, a multi-layer substrate, a gradient substrate, other applicable substrates, or a combination thereof. In some embodiments, the substrate 102 may include a semiconductor-on-insulator (SOI) substrate (e.g., a silicon-on-insulator substrate or a germanium-on-insulator substrate), and the SOI substrate may include a base, a buried oxide (BOX) layer disposed on the base and a semiconductor layer disposed on the buried oxide layer.

In some embodiments, a seed layer 104 is formed on the substrate 102. The seed layer 104 is disposed in the active region $A_A$ and the peripheral region $A_P$ of the semiconductor device. In some embodiments, the seed layer 104 is made of silicon (Si) or another applicable material. In some embodiments, the methods for forming the seed layer 104 include a selective epitaxial growth (SEG) process, a chemical vapor deposition (CVD) process (e.g., a vapor-phase epitaxy (VPE) process, a low pressure CVD (LPCVD) process, and/or an ultra-high vacuum CVD (UHV-CVD) process), a molecular beam epitaxy process, deposition of doped amorphous semiconductor (e.g., Si) followed by a solid-phase epitaxial recrystallization (SPER) step, methods of directly pasting seed crystals, or another applicable process.

In some embodiments, a buffer layer 106 is formed on the seed layer 104. As shown in FIG. 3A, the buffer layer 106 is disposed in the active region $A_A$ and the peripheral region $A_P$ of the semiconductor device. Formation of the buffer layer 106 may be helpful to mitigate the strain on a channel layer 108 that is subsequently formed on the buffer layer 106, and to prevent defects from forming in the overlying channel layer 108. In some embodiments, the buffer layer 106 includes AlN, GaN, $Al_xGa_{1-x}N$ (wherein 0<x<1), a combination of thereof, or the like. The buffer layer 106 may be formed using an epitaxial growth process, such as metal organic chemical vapor deposition (MOCVD), hydride vapor phase epitaxy (HVPE), molecular beam epitaxy (MBE), a combination thereof, or the like. Although the buffer layer 106 in the embodiment shown in FIG. 3A is a single layer, the buffer layer 106 may be a multilayered structure in other embodiments.

Next, a channel layer 108 is formed on the buffer layer 106. As shown in FIG. 3A, the channel layer 108 is disposed in the active region $A_A$ and the peripheral region $A_P$ of the semiconductor device. In some embodiments of the present disclosure, the channel layer 108 includes an undoped III-V group compound semiconductor material. For example, the channel layer 108 is made of undoped GaN, but the present disclosure is not limited thereto. In some other embodiments, the channel layer 108 includes AlGaN, AlN, GaAs, GaInP, AlGaAs, InP, InAlAs, InGaAs, other applicable III-V group compound materials, or a combination thereof. In some embodiments, the channel layer 108 is formed using a molecular-beam epitaxy method (MBE), a metalorganic chemical vapor deposition method (MOCVD), a hydride vapor phase epitaxy method (HVPE), other applicable methods, or a combination thereof.

Next, a barrier layer 110 is formed on the channel layer 108. As shown in FIG. 3A, the barrier layer 110 is disposed in the active region $A_A$ and the peripheral region $A_P$ of the semiconductor device. In some embodiments of the present disclosure, the barrier layer 110 includes an undoped III-V group compound semiconductor material. For example, the barrier layer 110 includes undoped $Al_xGa_{1-x}N$ (wherein 0<x<1), but the present disclosure is not limited thereto. In some other embodiments, the barrier layer 110 includes GaN, AlN, GaAs, GaInP, AlGaAs, InP, InAlAs, InGaAs, other applicable III-V group compound materials, or a combination thereof. In some embodiments, the barrier layer 110 is formed using a molecular-beam epitaxy method (MBE), a metalorganic chemical vapor deposition method (MOCVD), a hydride vapor phase epitaxy method (HVPE), other applicable methods, or a combination thereof.

In some embodiments, the channel layer 108 and the barrier layer 110 include different materials from each other such that a heterojunction is formed between the channel layer 108 and the barrier layer 110. Therefore, a two-dimensional electron gas (2DEG) which is generated by the band gap between the hetero-materials may be formed at the interface between the channel layer 108 and the barrier layer 110. In some embodiments, the semiconductor devices, such as high electron mobility transistors (HEMT), may utilize 2DEG as conductive carriers.

In some embodiments of the present disclosure, the GaN-containing composite layer 111 disposed in the active region $A_A$ and the peripheral region $A_P$ of the semiconductor device includes the buffer layer 106, the channel layer 108 and the barrier layer 110, as shown in FIG. 3A. However, the present disclosure is not limited thereto. The GaN-containing composite layer 111 may further include other films and/or layers. In some other embodiments, a carbon-doped layer is further formed between the buffer layer 106 and the channel layer 108 to increase the breakdown voltage of the semiconductor device.

Figure 3B:
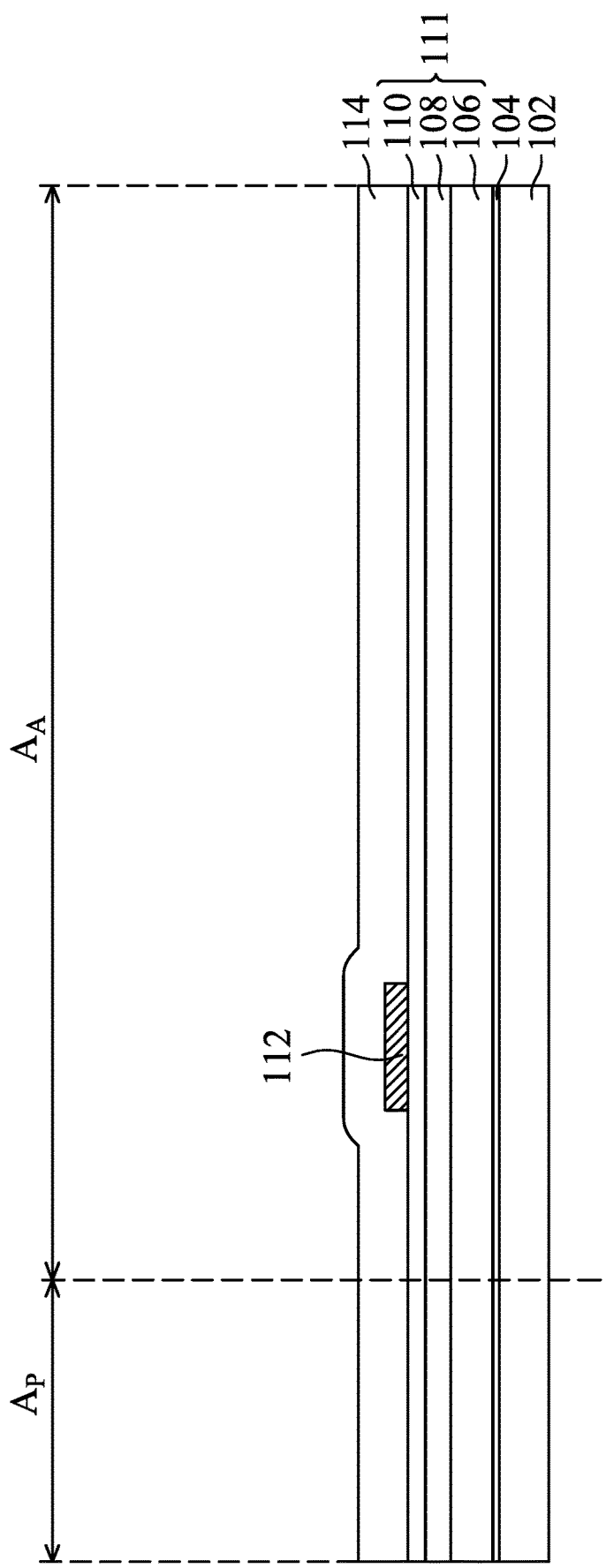

In some embodiments, a gate electrode 112 is then formed on the GaN-containing composite layer 111 in the active region $A_A$, as shown in FIG. 3B. In some embodiments, the material of the gate electrode 112 is a conductive material, such as Au, Ni, Pt, Pd, Ir, Ti, Cr, W, Al, Cu, TaN, TiN, $WSi_2$, or a combination thereof. The gate electrode 112 may be formed by atomic layer deposition (ALD), chemical vapor deposition (CVD), physical vapor deposition (PVD), sputtering or the like.

Next, in some embodiments, a dielectric layer 114 is formed on the GaN-containing composite layer 111 and conformably covers the gate electrode 112. The dielectric layer 114 not only is disposed in the active region $A_A$ but also extends to the peripheral region $A_P$ of the semiconductor device. Although the dielectric layer 114 of the embodiment shown in FIG. 3B is a single layer, the dielectric layer 114 may be a multilayered structure in other embodiments.

Additionally, the dielectric layer 114 may include silicon oxide, silicon nitride, silicon oxynitride, or other suitable dielectric materials. In some embodiments, the dielectric layer 114 is formed by chemical vapor deposition (CVD), physical vapor deposition (PVD), atomic layer deposition (ALD), high density plasma chemical vapor deposition (HDPCVD), or a combination of thereof.

Figure 3C:
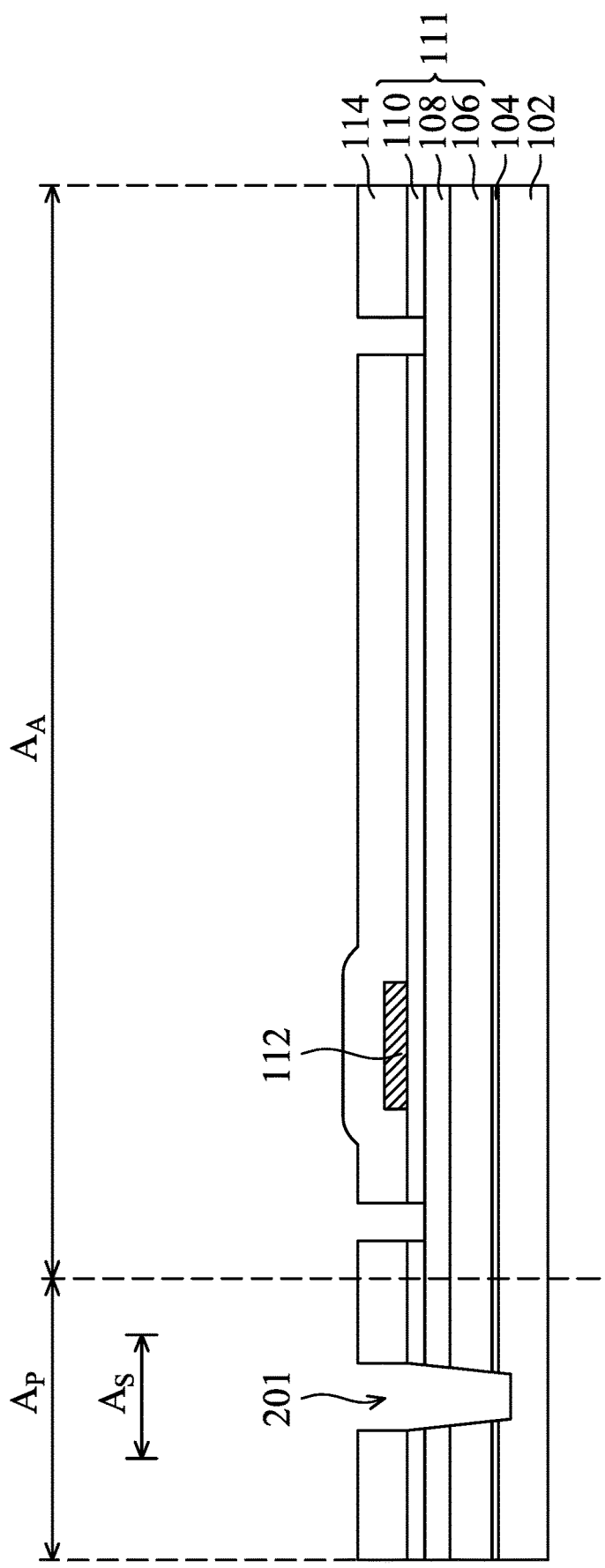

Afterwards, patterning steps are implemented on those aforementioned material layers such that openings 160 and 180 are formed in the active region $A_A$ and a trench 201 is formed in the seal region $A_S$ of the peripheral region $A_P$, in accordance with some embodiments of the present disclosure. The openings 160 and 180 are formed at two opposite sides of the gate electrode 112, and the trench 201 is disposed around the active region $A_A$. FIG. 3C is a cross-sectional view of the openings 160 and 180 and the trench 201 after fabrication, in accordance with some embodiments of the present disclosure.

In some embodiments, the trench 201 and the openings 160 and 180 are formed by etching. In some embodiments, the etching process may be a dry etching process, such as reactive ion etching (RIE), electron cyclotron resonance (ECR) etching, inductively-coupled plasma (ICP) etching, or the like.

In some embodiments of the present disclosure, etching equipment includes an etching chamber, a gas supply system, a bias power generator, a wafer platform, a shower head and an etching endpoint detector. The gas supply system provides an etchant which is used in the etching process. The bias power generator applies a bias power to the etching chamber to generate a bias electric field between an upper electrode (generally disposed at the top of the etching chamber) and a lower electrode (generally disposed inside of the wafer platform) of the etching equipment. The etchant is evenly dispersed into the etching chamber through the shower head. The etching endpoint detector of the etching equipment may monitor in real time the etching signals of the desired material layer to be removed in an etching process. During the etching process, the etchant is accelerated by the bias electric field in the etching chamber, and in the direction toward the wafer platform to anisotropically etch the dielectric layer 114 and the underlying GaN-containing composite layer 111.

In some embodiments of the present disclosure, an etching process including two etching steps can be implemented for patterning the dielectric layer 114 and the underlying GaN-containing composite layer 111. In some embodiments, the dielectric layer 114 and the GaN-containing composite layer 111 are etched using two mask layers with different patterns.

In some embodiments, the first etching step is performed to form openings 160 and 180 in the active region $A_A$ and a recess (not shown) in the seal region $A_S$ using a first mask layer (not shown). The recess is positioned correspondingly to the position of the trench 201 and has a depth substantially equal to the depths of the openings 160 and 180. In some embodiments, the recess and the openings 160 and 180 are extended to the barrier layer 110 to expose the channel layer 108. The depths of the recess and the openings 160 and 180 may be determined and varied according to carrier concentration and carrier mobility of 2DEG formed in the semiconductor device such as high electron mobility transistor (HEMT) of applications. After the first etching step, an ashing process is performed to remove the first mask layer.

Next, a second mask layer (not shown) is provided, and the recess is etched further by a second etching step of the etching process to form a trench 201, in accordance with some embodiments. In some embodiments, the trench 201 formed in the seal region $A_S$ is disposed around the active region $A_A$. Also, the trench 201 penetrates the dielectric layer 114, the GaN-containing composite layer 111 and the seed layer 104. In some embodiments, the trench 201 is further extended into the substrate 102 to remove a portion of the substrate 102. After the second etching step, an ashing process is performed to remove the second mask layer. Therefore, formations of the trench 201 and the openings 160 and 180 are completed, as shown in FIG. 3C.

Figure 3D:
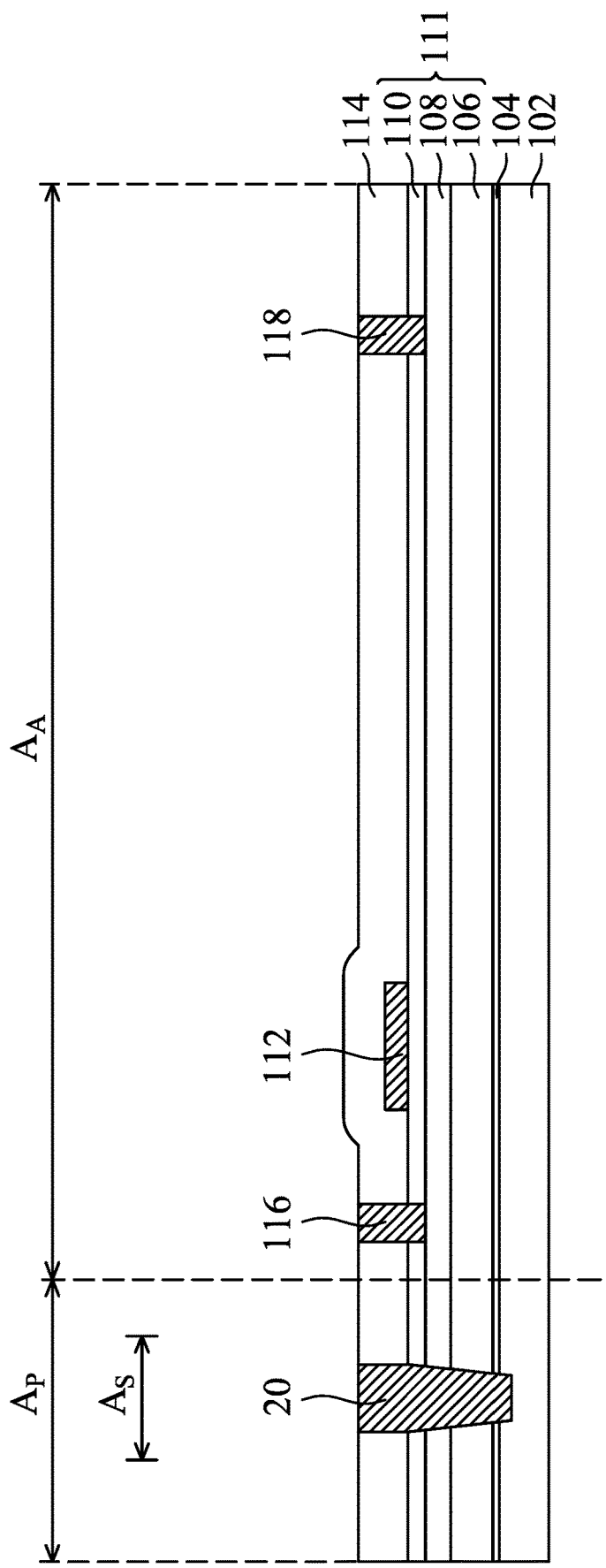

Next, as shown in FIG. 3D, a source electrode 116, a drain electrode 118 and a barrier structure 20 are formed by respectively depositing a suitable material in the openings 160 and 180 and the trench 201 following by any acceptable patterning process, in accordance with some embodiments. The source electrode 116 and the drain electrode 118 are formed at opposite sides of the gate electrode 112.

In some embodiments, the source electrode 116, the drain electrode 118 and the barrier structure 20 are formed of conductive materials, such as Au, Ni, Pt, Pd, Ir, Ti, Cr, W, Al, Cu, TaN, TiN, $WSi_2$, a combination thereof, or the like. The source electrode 116, the drain electrode 118 and the barrier structure 20 may be formed by atomic layer deposition (ALD), chemical vapor deposition (CVD), physical vapor deposition (PVD), electron beam evaporation, sputtering, or the like. In some embodiments, after a material layer of the source electrode 116 and the drain electrode 118 is deposited, a high-temperature thermal process such as an annealing process is performed to form source/drain ohmic contacts. In some embodiments, the high-temperature thermal process is a rapid thermal annealing process.

In FIG. 3D, the source electrode 116 and the drain electrode 118 are disposed on the channel layer 108 and electrically contact the channel layer 108, in accordance with some embodiments. In some embodiments, the barrier structure 20 penetrates the dielectric layer 114, the GaN-containing composite layer 111 and the seed layer 104. Also, the barrier structure 20 may further extend into the substrate 102.

In some embodiments, the barrier structure 20 and the source electrode 116/the drain electrode 118 are formed simultaneously by depositing a conductive material in the trench 201 and the openings 160 and 180 following by a patterning process. However, the present disclosure is not limited thereto. In some other embodiments, the barrier structure 20 and the source electrode 116/the drain electrode 118 are formed of different materials. For example, the barrier structure 20 can be formed of polysilicon or an insulating material such as a nitride or an oxide. Thus, the barrier structure 20 and the source electrode 116/the drain electrode 118 can be formed in different processes.

In some embodiments, the trench 201 is filled with a material (also referred as a barrier material) including a conductive material, a semiconductor material, an insulating material, or a combination thereof. In some embodiments, the barrier material includes one or more metals, polysilicon, a nitride, an oxide, or a combination thereof. In some embodiments, the metal of the barrier structure includes Au, Ni, Pt, Pd, Ir, Ti, Cr, W, Al, Cu, TaN, TiN, $WSi_2$, a combination thereof, or the like. In some embodiments, the barrier material for forming the barrier structure 20 is formed by atomic layer deposition (ALD), chemical vapor deposition (CVD), physical vapor deposition (PVD), electron beam evaporation, sputtering or the like.

Figure 3E:
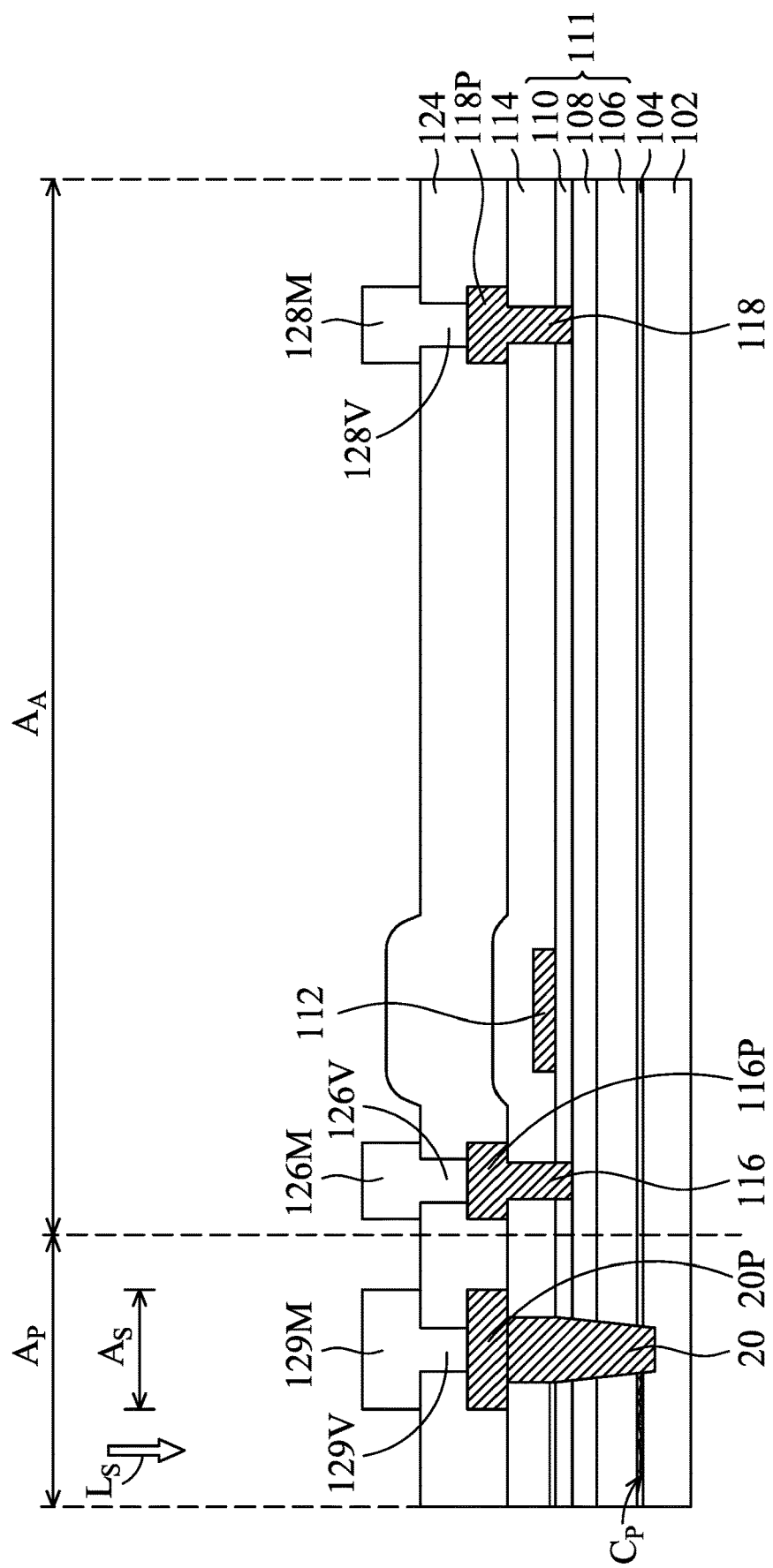

Next, as shown in FIG. 3E, an insulating layer 124 is formed on the barrier structure 20, the source electrode 116 and the drain electrode 118, in accordance with some embodiments. The insulating layer 124 conformably covers the barrier structure 20, the source electrode 116 and the drain electrode 118. In some embodiments, the insulating layer 124 is disposed in the active region $A_A$ and extended to the peripheral region $A_P$.

Next, in some embodiments, the insulating layer 124 is patterned to form several holes (not shown) exposing the source electrode 116, the drain electrode 118 and the barrier structure 20. A metal material layer is then deposited on the insulating layer 124 and fills up the holes, followed by any acceptable patterning process. Thus, the conductive vias 126V, 128V, 129V and the metal portions 126M, 128M, 129M are formed, as shown in FIG. 3E.

In FIG. 3E, the metal portion 126M is disposed on the conductive via 126V and electrically connected to the source electrode 116, and the metal portion 128M is disposed on the conductive via 128V and electrically connected to the drain electrode 118, in accordance with some embodiments. In some embodiments, the metal portion 129M is disposed on the conductive via 129V and electrically connected to the barrier structure 20. The materials and processes used to form the conductive vias 126V, 128V, 129V and the metal portions 126V, 128M, 129M are similar to, or the same as, those used to form the gate electrode 112, and are not repeated herein.

In some embodiments, a sealing component $R_C$ is disposed above the barrier structure 20 in the seal region $A_S$. The sealing component $R_C$ and the barrier structure 20 may be integrated as a sealing structure $S_D$. In some embodiments, the sealing component $R_C$ includes the metal portion 129M and the conductive via 129V, as shown in FIG. 3E.

In some embodiments, the metal portions 126M, 128M and 129M are collectively referred as the first metal layer. Although FIG. 3E depicts the insulating layer 124 and the first metal layer for illustration, more insulating layers (not shown) and more metal layers (not shown) are alternately stacked on the first metal layer in subsequent processes. For example, a first inter-metal dielectric (typically known as "IMD-1") layer, a second metal layer, a second inter-metal dielectric (typically known as "IMD-2") layer, a third metal layer can be subsequently formed on the first metal layer. Also, several conductive vias are formed within the inter-metal dielectric layers to electrically connect adjacent metal layers. In some embodiments, a sealing component $R_C$ of a sealing structure $S_D$ includes the metal portions of the metal layers and the conductive vias extending in the inter-metal dielectric layers for connecting adjacent metal portions.

Thus, in some embodiments, a sealing component $R_C$ disposed in the seal region $A_S$ includes several metal portions of the metal layers and the conductive vias extending in the dielectric layers. The sealing component $R_C$ may be a seal ring that surrounds the active region $A_A$ in a closed manner. Formation of the sealing component $R_C$ prevents related layers/components from mechanical damages during wafer dicing or sawing. Also, the sealing component $R_C$ can be connected to a ground plane to reduce undesired signal interferences. Moreover, the sealing component $R_C$ prevents moisture penetration into the active region $A_A$ through a cutting plane. It is known that related layers/components in the active region $A_A$ absorbing moisture deteriorates electrical performance of the semiconductor device.

In some embodiments, the barrier structure 20 is connected to the sealing component $R_C$ disposed above. In some embodiments, the barrier structure 20 is formed of an insulating material, and the sealing component $R_C$ is physically connected to the barrier structure 20. In some other embodiments, the barrier structure 20 is formed of a conductive material (such as metal or polysilicon), and the sealing component $R_C$ is electrically connected to the barrier structure 20.

In some embodiments, the semiconductor device includes an epitaxially grown composite layer, such as the GaN-containing composite layer 111. Since the GaN-containing composite layer 111 is epitaxially grown from the seed layer 104, the lattice mismatching degree between the GaN-containing composite layer 111 and the seed layer 104 is large. Therefore, when the wafer dicing is performed, it is easy to generate cracks at an interface between the GaN-containing composite layer 111 and the seed layer 104. For example, a crack $C_P$ is generated between the buffer layer 106 and the seed layer 104, as shown in FIG. 3E. According to some embodiments, formation of the barrier structure 20 can effectively block the cracks $C_P$ from entering the active region $A_A$.

Additionally, in some embodiments, the barrier structure 20 includes a conductive material and can be connected to a ground plane to reduce signal interference. Also, in some embodiments, the barrier structure 20 prevents moisture penetration into the active region $A_A$ through the cutting plane, thereby improving electrical performance of the semiconductor device.

According to the method of manufacturing the semiconductor device as described above, the barrier structure 20 is formed after the gate electrode 112 is covered by the dielectric layer 114, but the methods of the present disclosure are not limited thereto. In other embodiments, after the GaN-containing composite layer 111 is epitaxially grown, a trench is formed and filled with a barrier material, thereby forming a barrier structure penetrating the GaN-containing composite layer 111 and the seed layer 104. During formation of a source electrode 116 and a drain electrode 118, a conductive portion is simultaneously formed on the barrier structure such that a sealing component $R_C$ can be electrically connected to the barrier structure 20 by the conductive portion.

The structures of the embodiments can be applied to many different types of semiconductor devices. In some embodiments, the semiconductor device is a depletion mode (i.e. normally-on) high-electron mobility transistor (HEMT), as shown in FIG. 3E. In some embodiments, the semiconductor device is an enhanced mode (i.e. normally-off) high-electron mobility transistor (HEMT).

Figure 4:
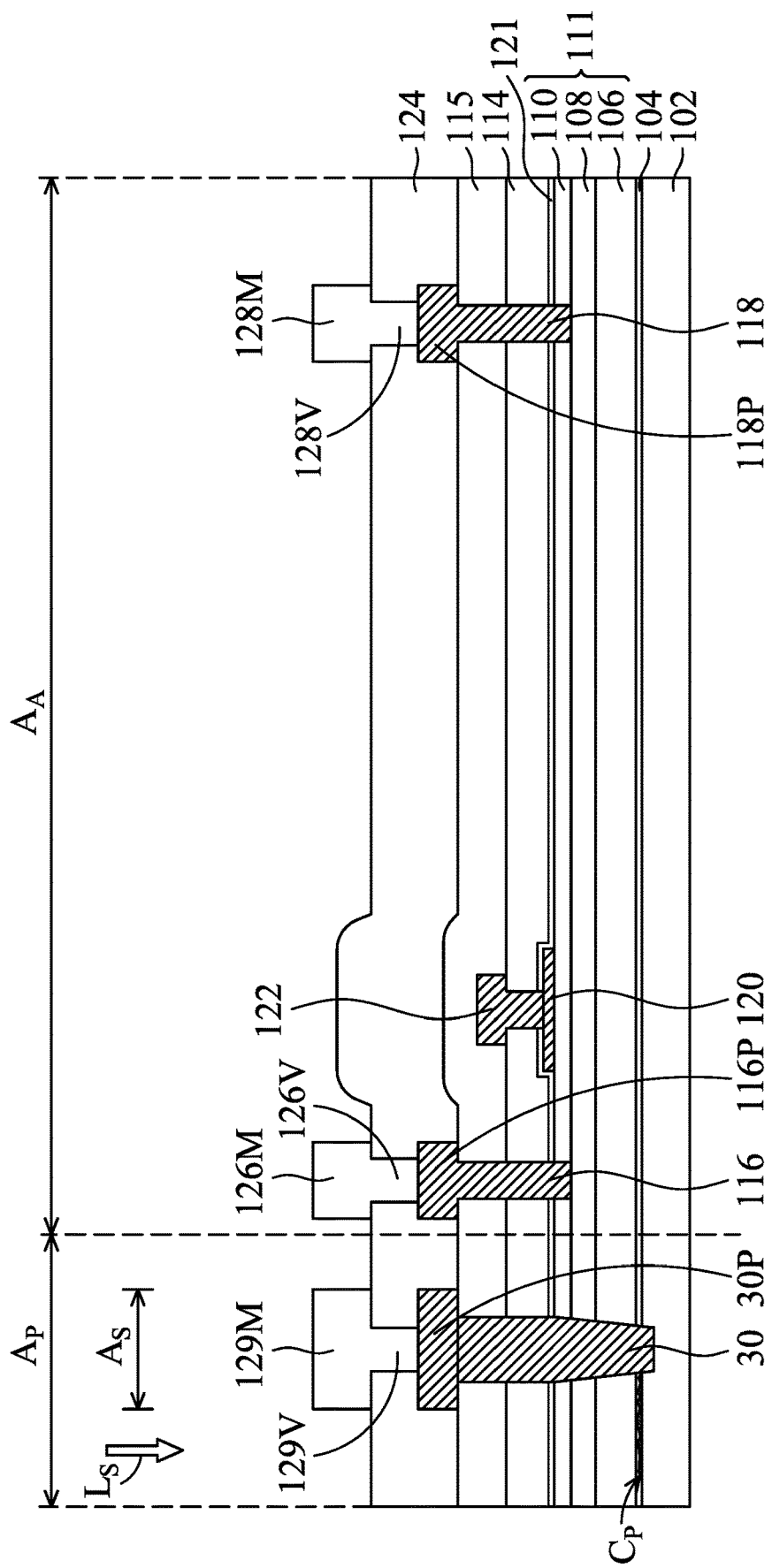
FIG. 4 is a cross-sectional view of a semiconductor device, in accordance with some embodiments of the present disclosure.

FIG. 4 is a cross-sectional view of a semiconductor device, in accordance with some embodiments of the present disclosure. The processes performed and the materials used to form the structure of FIG. 4 are similar to, or the same as, those used to form the structure of FIG. 3E, and those details are not repeated herein.

The difference between the structures of FIG. 3E and FIG. 4 is that a gate electrode of an enhanced mode high-electron mobility transistor (HEMT) of FIG. 4 includes a gate structure 120 and a gate metal layer 122.

In some embodiments of the present disclosure, a gate structure 120 is formed on the GaN-containing composite layer 111. As shown in FIG. 4, the gate structure 120 is formed on the barrier layer 110. In some embodiments, the gate structure 120 is made of p-type doped gallium nitride (GaN). In some other embodiments, the gate structure 120 includes aluminium gallium nitride (AlGaN), gallium nitride (GaN), aluminium nitride (AlN), gallium arsenide (GaAs), gallium indium phosphide (GaInP), aluminium gallium arsenide (AlGaAs), indium phosphide (InP), indium aluminum arsenide (InAlAs), indium gallium arsenide (InGaAs), another applicable III-V group compound material, or a combination thereof. In addition, the methods for forming the gate structure 120 may include the aforementioned deposition or epitaxy processes, and ion implantation or in-situ doping processes.

Moreover, in some embodiments, a silicon-containing insulating layer 121 is further formed on the barrier layer 110. The silicon-containing insulating layer 121 conformably covers the barrier layer 110. In some embodiments, the silicon-containing insulating layer 121 includes silicon oxide, silicon nitride, silicon oxynitride, a combination thereof, or the like. In some embodiments, the silicon-containing insulating layer 121 is a high-quality film formed by using atomic layer deposition (ALD), thermal oxidation or similar deposition processes. Formation of the high-quality film of the silicon-containing insulating layer 121 on the barrier layer 110 can help prevent leak currents from subsequently forming in the source electrode 116, drain electrode 118 or gate electrode 122.

In some embodiments, a dielectric layer 114 is formed on the silicon-containing insulating layer 121, and a gate metal layer 122 is formed on the dielectric layer 114, as shown in FIG. 4. The gate metal layer 122 is electrically connected to the gate metal layer 122. In some embodiments, the gate metal layer 122 is made of a conductive material, such as nickel (Ni), gold (Au), a combination thereof, or another applicable material. The gate metal layer 122 and the gate structure 120 may have Schottky contact formed therebetween. In some embodiments, the gate metal layer 122 is formed by atomic layer deposition (ALD), chemical vapor deposition (CVD), physical vapor deposition (PVD), sputtering, or the like.

In some embodiments, another dielectric layer 115 is formed on the dielectric layer 114, and the dielectric layer 115 conformably covers the gate metal layer 122, as shown in FIG. 4. The materials and processes used to form the dielectric layer 115 may be similar to, or the same as, those used to form the dielectric layer 114, and are not repeated herein.

Next, a source electrode 116 and a drain electrode 118 are formed at opposite sides of the gate metal layer 122 in the active region $A_A$. A barrier structure 30 is formed in the seal region $A_S$ of the peripheral region $A_P$. As shown in FIG. 4, the source electrode 116 and the drain electrode 118 are disposed on the channel layer 108 and electrically contact the channel layer 108, in accordance with some embodiments. In some embodiments, the barrier structure 30 penetrates the dielectric layers 115 and 114, the GaN-containing composite layer 111 and the seed layer 104. Also, the barrier structure 30 may further extend into the substrate 102. The materials and processes used to form the barrier structure 30, the source electrode 116 and the drain electrode 118 have been described above, and those details are not repeated herein.

Afterwards, related components of a to-be-formed semiconductor device, such as a high-electron mobility transistor (HEMT), are formed on the source electrode 116, the drain electrode 118 and the barrier structure 30. Examples of those related components include the conductive vias 126V, 128V, 129V and the metal portions 126M, 128M, 129M, as shown in FIG. 4. In some embodiments, the metal portions 126M, 128M and 129M are collectively referred as the first metal layer. More metal layers (not shown) and more inter-metal dielectric layers (not shown) are alternately formed on the first metal layer in subsequent processes. Also, a sealing component $R_C$ is formed above the barrier structure 30 in the seal region $A_S$. In some embodiments, the sealing component $R_C$ in the seal region $A_S$ includes one or more conductive vias (containing the conductive via 129V) and one or more metal portion (containing the metal portion 129M) electrically connected to each other. In some embodiments, the sealing component $R_C$ and the barrier structure 30 are integrated as a sealing structure $S_D'$. The materials and processes used to form the related components and the configurations as formed have been described above, and those details are not repeated herein.

Figure 5:
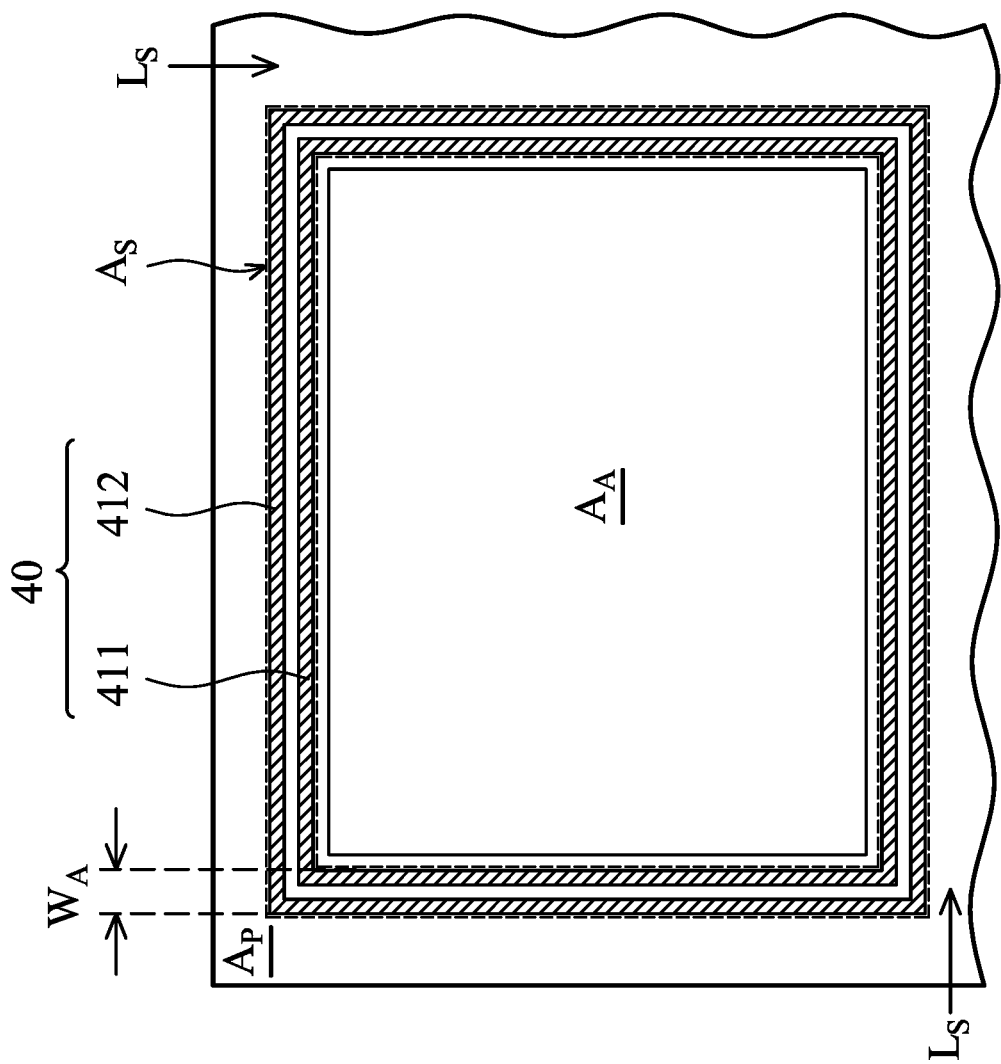
FIG. 5 is a top view of a barrier structure of a semiconductor device in accordance with some embodiments of the present disclosure.

FIG. 5 is a top view of a barrier structure of a semiconductor device in accordance with some embodiments of the present disclosure. Compared to a single closed ring surrounding an active region $A_A$ as the barrier structure 20 depicted in FIG. 2, the barrier structure 40 includes two closed rings 411 and 412 in the seal region $A_S$, and the closed rings 411 and 412 surround one of the active regions $A_A$.

Configurations of the barrier structures of the embodiments are not limited to the types of closed rings as shown in FIG. 2 and FIG. 5. In some embodiments, the barrier structure includes several barrier portions distributed in the seal regions $A_S$, and the barrier portions are arranged in at least two rows around the active region $A_A$, such as arranged correspondingly to the circumference of the active region $A_A$.

Figure 6:
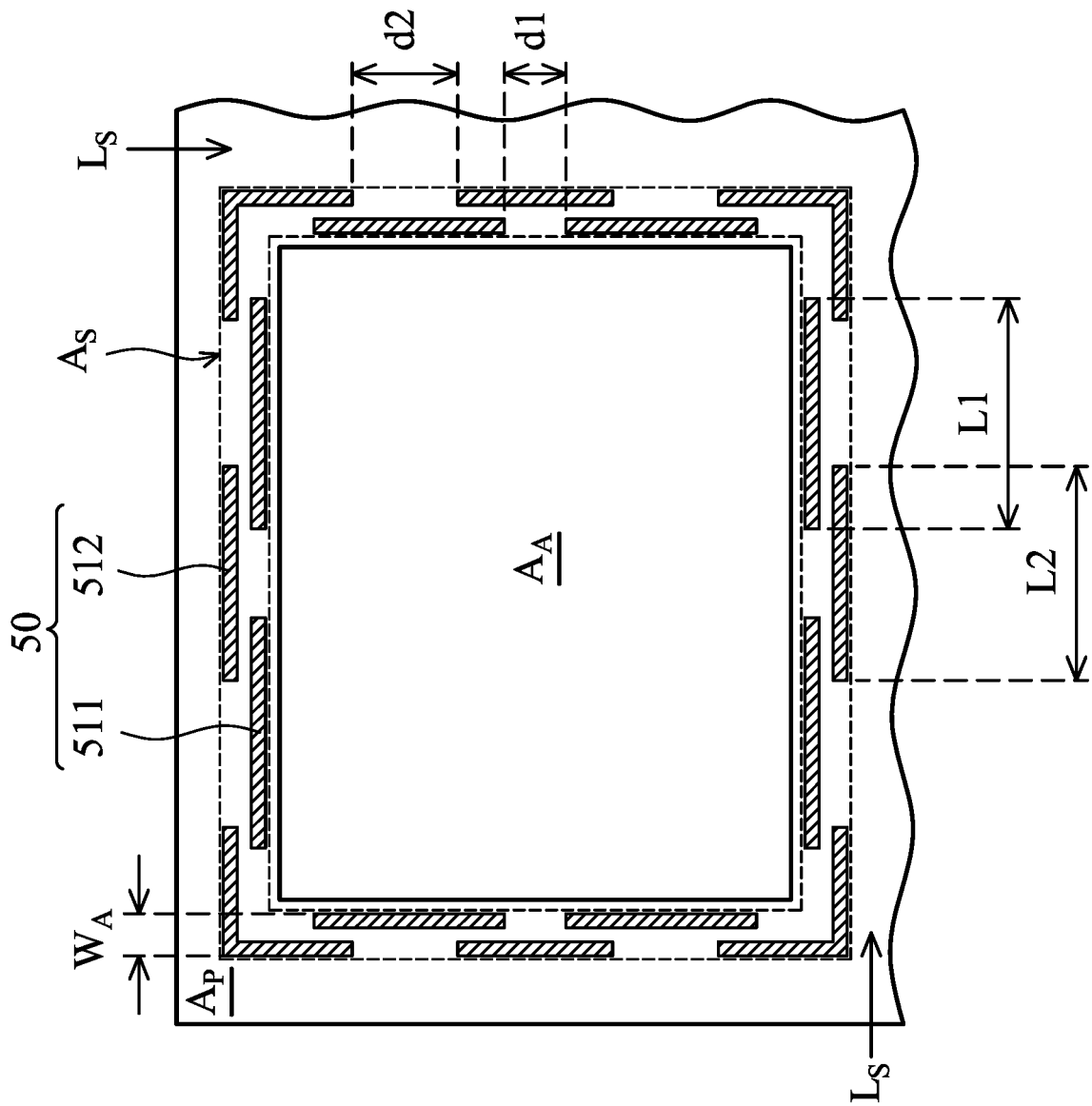
FIG. 6 is a top view of a barrier structure of a semiconductor device in accordance with some embodiments of the present disclosure.

FIG. 6 is a top view of a barrier structure of a semiconductor device in accordance with some embodiments of the present disclosure. In some embodiments, the barrier structure 50 in the seal region $A_S$ includes several first barrier portions 511 and several second barrier portions 512. As shown in FIG. 6, the first barrier portions 511 are disposed adjacent to the active region $A_A$, and the second barrier portions 512 are disposed adjacent to the cutting lines $L_S$. Also, the second barrier portions 512 are misaligned with the first barrier portions 511.

In some embodiments, the first barrier portions 511 are separated from each other, and the second barrier portions 512 are separated from each other. Also, the second barrier portions 512 are positioned in such a way that they correspond to the intervals between adjacent first barrier portions 511. From a top view of the substrate, the upper surfaces of the first barrier portions 511 and the second barrier portions 512 have rectangular shapes, as shown in FIG. 6. In some embodiments, each of the first barrier portions 511 has the first length L1, and the first barrier portions 511 are separated from each other by the first distance d1. Each of the second barrier portions 512 has the second length L2, and the second barrier portions 512 are separated from each other by the second distance d2. In some embodiments, the length of each of the second barrier portions 512 near the cutting lines $L_S$ is greater than the distance between two adjacent first barrier portions 511. That is, the second length L2 is greater than the first distance d1. Configurations of the first barrier portions 511 and the second barrier portions 512 effectively block cracks from entering the active region $A_A$ during wafer dicing.

In some embodiments, the barrier portions arranged in the same row, such as the first barrier portions 511 or the second barrier portions 512, may have the same length or different lengths. The barrier portions arranged in the same row, such as the first barrier portions 511 or the second barrier portions 512, may be separated from each other by the same distance or different distances. Additionally, the barrier portions arranged in the different rows may have the same length or different lengths. For example, the first length L1 may be equal to or different from the second length L2. Also, the barrier portions arranged in the different rows may be separated from each other by the same distance or different distances. For example, the first distance d1 may be equal to or different from the second distance d2. Thus, the lengths of the barrier portions and the distances between the barrier portions in FIG. 6 are depicted for illustrating one exemplary embodiment, not for limiting the present disclosure.

In some embodiments, from a top view of the substrate 102, the upper surfaces of the barrier portions have rectangular shapes, square shapes, round shapes, irregular shapes, or a combination thereof.

Figure 7:
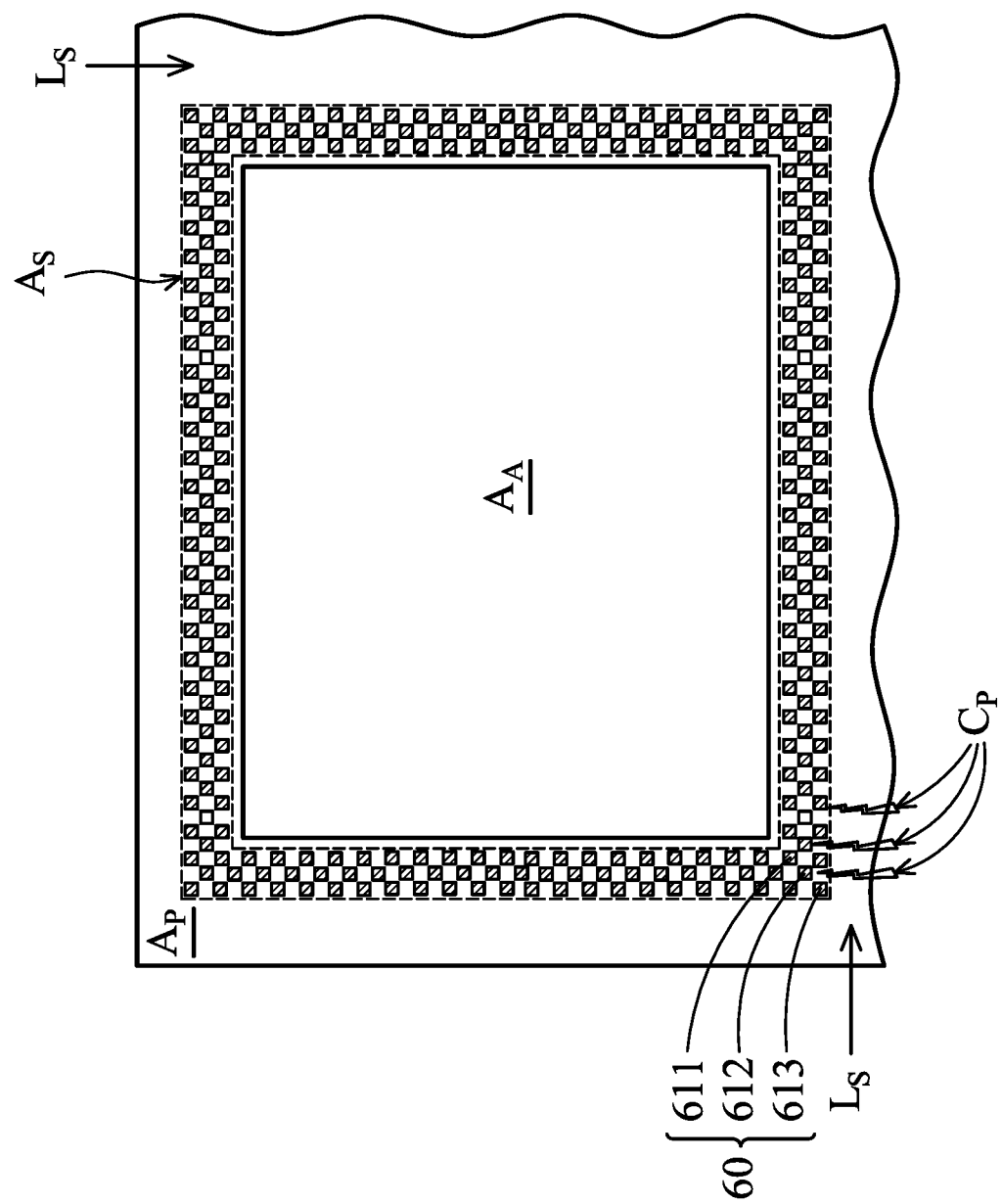
FIG. 7 is a top view of a barrier structure of a semiconductor device in accordance with some embodiments of the present disclosure.

FIG. 7 is a top view of a barrier structure of a semiconductor device in accordance with some embodiments of the present disclosure. In some embodiments, the barrier structure 60 includes several barrier portions distributed in the seal region $A_S$, and those barrier portions are arranged in three rows around the active region $A_A$; for example, they may be arranged to correspond to the circumference of the active region $A_A$. From a top view of the substrate, the upper surfaces of the barrier portions have square shapes, as shown in FIG. 7. In some embodiments, the barrier structure 60 in the seal region $A_S$ includes several first barrier portions 611, several second barrier portions 612 and several third barrier portions 613. The first barrier portions 611 are disposed adjacent to the active region $A_A$, and the third barrier portions 613 are disposed adjacent to the cutting lines $L_S$. The first barrier portions 611 are misaligned with the second barrier portions 612, and the second barrier portions 612 are misaligned with the third barrier portions 613. During wafer dicing, the barrier structure 60 can effectively blocks cracks generated between the GaN-containing composite layer and the seed layer from entering the active region $A_A$.

Figure 8:
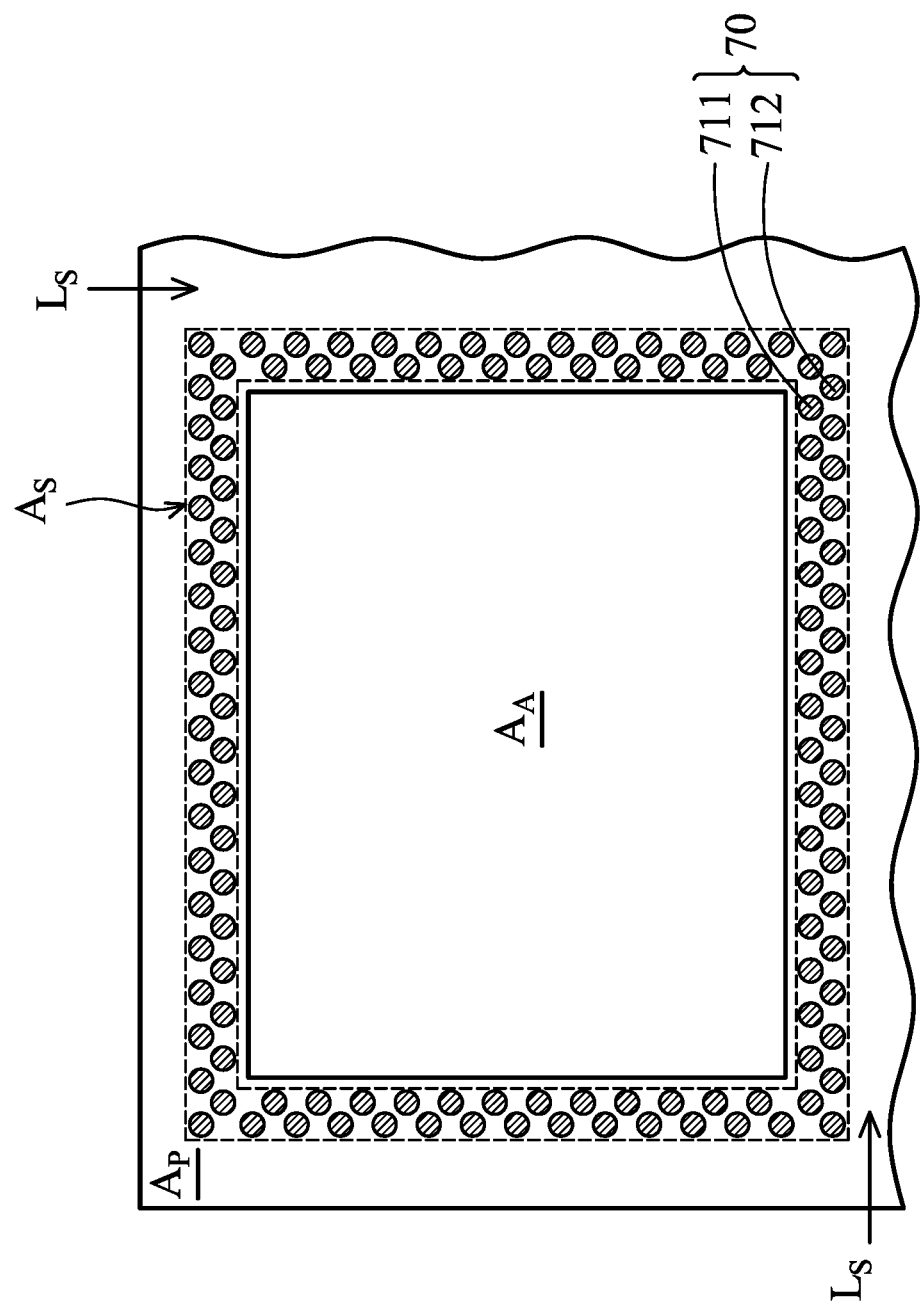
FIG. 8 is a top view of a barrier structure of a semiconductor device in accordance with some embodiments of the present disclosure.

FIG. 8 is a top view of a barrier structure of a semiconductor device in accordance with some embodiments of the present disclosure. In some embodiments, the barrier structure 70 includes several barrier portions distributed in the seal region $A_S$. In some embodiments, the barrier structure 70 includes several first barrier portions 711 adjacent to the active region $A_A$ and several second barrier portions 712 adjacent to the cutting lines $L_S$. The first barrier portions 711 are misaligned with the second barrier portions 712 such that the barrier structure 70 can effectively blocks cracks between the GaN-containing composite layer and the seed layer, caused by wafer, dicing from entering the active region $A_A$. From a top view of the substrate, the upper surfaces of the barrier portions have round shapes, as shown in FIG. 8.

Figure 9:
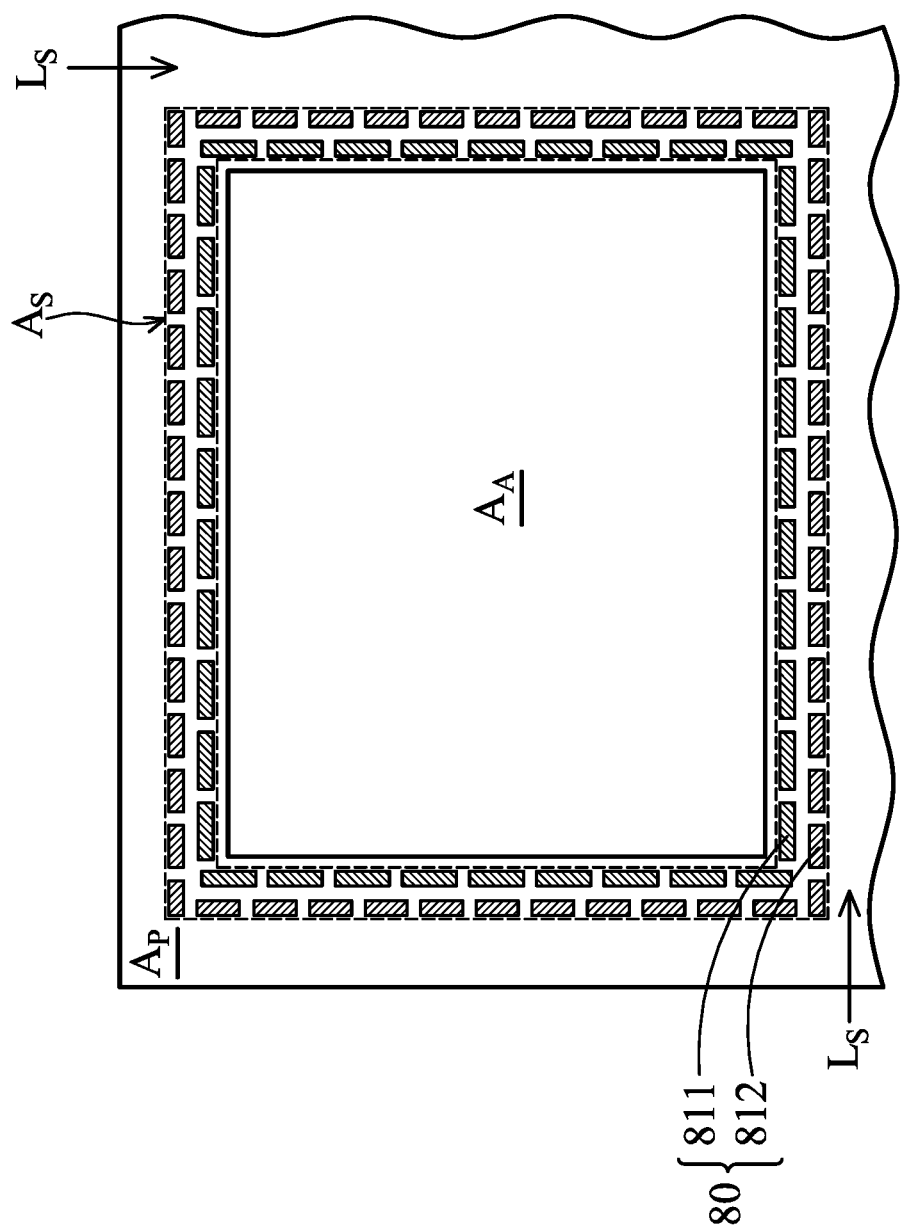
FIG. 9 is a top view of a barrier structure of a semiconductor device in accordance with some embodiments of the present disclosure.

FIG. 9 is a top view of a barrier structure of a semiconductor device in accordance with some embodiments of the present disclosure. In some embodiments, the barrier structure 80 includes several barrier portions distributed in the seal region $A_S$. In some embodiments, the barrier structure 80 includes several first barrier portions 811 adjacent to the active region $A_A$ and several second barrier portions 812 adjacent to the cutting lines $L_S$. The first barrier portions 811 are misaligned with the second barrier portions 812. From a top view of the substrate, the upper surfaces of the barrier portions have rectangular shapes, as shown in FIG. 9. In addition, the barrier portions arranged in different rows may include the same material or different materials. In some embodiments, the first barrier portions 811 includes the first conductive material, and the second barrier portions 812 includes the second conductive material different from the first conductive material. In some embodiments, the first barrier portions 811 include an insulating material, and the second barrier portions 812 include a conductive material.

In summary, a semiconductor device of some embodiments includes an active region $A_A$ and a peripheral region $A_P$. The peripheral region $A_P$ includes a seal region $A_S$ and cutting lines $L_S$. A sealing component is disposed in the seal region $A_S$, and disposed at peripheries of the active region $A_A$. In some embodiment, a sealing structure in the seal region $A_S$ includes a barrier structure and a sealing component formed above the barrier structure. The barrier structure at least penetrates the GaN-containing composite layer and the seed layer. When the wafer dicing is performed along the cutting lines $L_S$, the sealing component prevents the layers from mechanical damages, and the underlying barrier structure of the embodiments effectively blocks the cracks generating between the GaN-containing composite layer 111 and the seed layer 104 from entering the active region $A_A$. Thus, electrical components fabricated in the active region $A_A$ can be protected effectively, thereby significantly improving the yield and the quality of the electrical components of the semiconductor device. In addition, in some embodiments, the barrier structure is connected to the sealing component positioned above, which prevents moisture penetration into the active region $A_A$ through a cutting plane, thereby improving the electrical performance and prolonging the operation life of the semiconductor device. In some embodiments, the barrier structure includes a conductive material. The sealing component and the underlying barrier structure can be electrically connected to each other, and the barrier structure can be further connected to a ground plane, thereby reducing the undesired signal interference to the electrical components in the active region $A_A$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, having an active region and a peripheral region adjacent to the active region, wherein the semiconductor device comprises:
    a semiconductor substrate;
    a seed layer disposed on the semiconductor substrate in the active region and the peripheral region;
    a GaN-containing composite layer disposed on the seed layer in the active region and the peripheral region;
    a gate electrode disposed on the GaN-containing composite layer in the active region;
    a source electrode and a drain electrode disposed on the GaN-containing composite layer in the active region, wherein the source electrode and the drain electrode are disposed at opposite sides of the gate electrode; and
    a sealing structure disposed in a seal region of the peripheral region, wherein the sealing structure comprises a barrier structure and a sealing component on the barrier structure, wherein the barrier structure is disposed around the active region, the barrier structure penetrates the GaN-containing composite layer and the seed layer, and the barrier structure extends into the semiconductor substrate.

2. The semiconductor device as claimed in claim 1, further comprising cutting lines in the peripheral region, wherein the barrier structure in the seal region is disposed between the cutting lines and the active region.

3. The semiconductor device as claimed in claim 1, further comprising a dielectric layer disposed on the GaN-containing composite layer and covering the gate electrode, wherein the barrier structure penetrates the dielectric layer, the GaN-containing composite layer and the seed layer.

4. The semiconductor device as claimed in claim 1, wherein the barrier structure is connected to the sealing component.

5. The semiconductor device as claimed in claim 1, further comprising:
    an insulating layer disposed on the source electrode, the drain electrode and the barrier structure;
    a conductive via positioned in the insulating layer and on the barrier structure; and
    a metal portion disposed on the insulating layer and electrically connected to the conductive via,
    wherein the sealing component comprises the metal portion and the conductive via.

6. The semiconductor device as claimed in claim 1, wherein the barrier structure comprises a metal, polysilicon, a nitride, an oxide, or a combination thereof.

7. The semiconductor device as claimed in claim 1, wherein the barrier structure comprises a conductive material and is electrically connected to a ground plane.

8. The semiconductor device as claimed in claim 1, wherein the barrier structure comprises a closed ring surrounding an active region.

9. The semiconductor device as claimed in claim 1, wherein the barrier structure comprises barrier portions, and the barrier portions are arranged in at least two rows around the active region.

10. The semiconductor device as claimed in claim 9, wherein from a top view of the semiconductor substrate, upper surfaces of the barrier portions have rectangular shapes, square shapes, round shapes, irregular shapes, or a combination thereof.

11. The semiconductor device as claimed in claim 1, wherein the barrier portions comprise:
    first barrier portions; and
    second barrier portions adjacent to the first barrier portions and misaligned with the second barrier portions,
    wherein the first barrier portions are disposed between the second barrier portions and the active region.

12. The semiconductor device as claimed in claim 11, wherein a length of each of the second barrier portions is greater than a distance between two adjacent first barrier portions.

13. The semiconductor device as claimed in claim 1, wherein the GaN-containing composite layer comprises a buffer layer, a channel layer on the buffer layer and a barrier layer on the channel layer.

14. A method of manufacturing a semiconductor device, the semiconductor device having an active region and a peripheral region adjacent to the active region, and the method comprising:
    providing a semiconductor substrate;
    forming a seed layer on the semiconductor substrate in the active region and the peripheral region;
    forming a GaN-containing composite layer on the seed layer in the active region and the peripheral region;
    forming a barrier structure in a seal region of the peripheral region, wherein the barrier structure is disposed around the active region, the barrier structure penetrates the GaN-containing composite layer and the seed layer, and the barrier structure extends into the semiconductor substrate;

forming a gate electrode on the GaN-containing composite layer in the active region;

forming a source electrode and a drain electrode disposed on the GaN-containing composite layer in the active region, wherein the source electrode and the drain electrode are disposed at opposite sides of the gate electrode; and forming a sealing component on the barrier structure in the seal region, wherein the sealing component and the barrier structure form a sealing structure.

15. The method as claimed in claim 14, wherein forming the barrier structure comprises:

forming a trench in the seal region and adjacent to the active region, wherein the trench at least penetrates the GaN-containing composite layer and the seed layer; and depositing a barrier material in the trench to form the barrier structure.

16. The method as claimed in claim 15, wherein the trench extends into the semiconductor substrate.

17. The method as claimed in claim 14, wherein the barrier structure in the seal region is disposed between cutting lines and the active region, and the cutting lines are positioned in the peripheral region.

18. The method as claimed in claim 14, further comprising:

forming a dielectric layer on the GaN-containing composite layer and covering the gate electrode, wherein the dielectric layer extends to the peripheral region;

forming openings at the opposite sides of the gate electrode;

forming a trench in the seal region of the peripheral region and around the active region, wherein the trench penetrates the dielectric layer, the GaN-containing composite layer and the seed layer; and depositing a conductive material in the trench and the openings to form the barrier structure, the source electrode and the drain electrode.

19. The method as claimed in claim 14, further comprising:

forming an insulating layer on the source electrode, the drain electrode and the barrier structure;

forming a hole in the insulating layer, wherein the hole is located above the barrier structure;

depositing a metal material layer on the insulating layer, wherein the hole is filled with the metal material layer to form a conductive via; and patterning the metal material layer to form a metal portion on the conductive via, wherein the sealing component comprises the metal portion and the conductive via.

20. The method as claimed in claim 14, wherein forming the barrier structure comprises:

forming a closed ring surrounding the active region.

21. The method as claimed in claim 14, wherein forming the barrier structure comprises:

forming barrier portions in the seal region, wherein the barrier portions are arranged in at least two rows around the active region, and the at least two rows of the barrier portions are misaligned with each other.

22. The method as claimed in claim 14, wherein forming the GaN-containing composite layer comprises:

forming a buffer layer;

forming a channel layer on the buffer layer; and forming a barrier layer on the channel layer.

* * * * *